(12) United States Patent
Ko et al.

(10) Patent No.: US 12,211,816 B2
(45) Date of Patent: Jan. 28, 2025

(54) PRINTED CIRCUIT BOARD AND ELECTRONIC COMPONENT PACKAGE INCLUDING THE SAME

(71) Applicant: SAMSUNG ELECTRO-MECHANICS CO., LTD., Suwon-si (KR)

(72) Inventors: Young Kuk Ko, Suwon-si (KR); Sang Hoon Kim, Suwon-si (KR); Suk Chang Hong, Suwon-si (KR); Chi Won Hwang, Suwon-si (KR); Gyu Mook Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 144 days.

(21) Appl. No.: 17/682,135

(22) Filed: Feb. 28, 2022

(65) Prior Publication Data

US 2022/0320027 A1 Oct. 6, 2022

(30) Foreign Application Priority Data

Apr. 1, 2021 (KR) .......... 10-2021-0042771
Aug. 31, 2021 (KR) .......... 10-2021-0115617

(51) Int. Cl.
| | |
|---|---|
| *H01L 23/00* | (2006.01) |
| *H01L 21/683* | (2006.01) |
| *H01L 23/13* | (2006.01) |
| *H01L 23/31* | (2006.01) |
| *H01L 23/485* | (2006.01) |

(Continued)

(52) U.S. Cl.
CPC .......... *H01L 24/19* (2013.01); *H01L 23/3128* (2013.01); *H01L 23/485* (2013.01); *H01L 23/49827* (2013.01); *H01L 23/5389* (2013.01); *H01L 24/20* (2013.01); *H01L 2224/04105* (2013.01); *H01L 2224/73265* (2013.01)

(58) Field of Classification Search
CPC ... H01L 24/19; H01L 23/3128; H01L 23/485; H01L 23/49827; H01L 23/5389; H01L 24/20; H01L 2224/04105; H01L 2224/73265; H05K 3/4697; H05K 1/185
See application file for complete search history.

(56) References Cited

U.S. PATENT DOCUMENTS

2006/0097370 A1* 5/2006 Bartley ............ H01L 23/49838
257/E23.07
2007/0148420 A1 6/2007 Salama et al.
(Continued)

FOREIGN PATENT DOCUMENTS

| KR | 10-0817075 B1 | 3/2008 |
| KR | 10-2015-0135048 A | 12/2015 |
| KR | 10-2019-0042975 A | 4/2019 |

OTHER PUBLICATIONS

Office Action dated Jul. 17, 2024, issued in related U.S. Appl. No. 18/132,096.

*Primary Examiner* — Antonio B Crite
(74) *Attorney, Agent, or Firm* — Morgan, Lewis & Bockius LLP

(57) ABSTRACT

A printed circuit board includes: a first insulating layer; a first cavity disposed in one surface of the first insulating layer; a plurality of protrusion portions spaced apart from each other in the first cavity; and a first wiring layer embedded in the one surface of the first insulating layer.

20 Claims, 10 Drawing Sheets

(51) Int. Cl.
*H01L 23/498* (2006.01)
*H01L 23/538* (2006.01)
*H05K 1/02* (2006.01)
*H05K 1/14* (2006.01)
*H05K 1/18* (2006.01)

(56) References Cited

U.S. PATENT DOCUMENTS

| | | |
|---|---|---|
| 2008/0111224 A1 | 5/2008 | Byun et al. |
| 2008/0315385 A1* | 12/2008 | Gerber .................. H01L 21/565 257/E21.511 |
| 2010/0019368 A1* | 1/2010 | Shin ..................... H01L 25/0657 257/E23.141 |
| 2012/0241941 A1* | 9/2012 | Kim ....................... H01L 23/367 438/122 |
| 2012/0286418 A1* | 11/2012 | Lee ......................... H01L 24/11 257/737 |
| 2013/0175686 A1* | 7/2013 | Meyer .................... H01L 24/17 257/737 |
| 2015/0014027 A1* | 1/2015 | Kaneko .................. H05K 1/113 174/255 |
| 2015/0200355 A1 | 7/2015 | Erie et al. |
| 2015/0279731 A1 | 10/2015 | Li et al. |
| 2015/0342046 A1 | 11/2015 | Kim et al. |
| 2016/0064319 A1* | 3/2016 | Suzuki .............. H01L 23/49866 174/251 |
| 2016/0252688 A1* | 9/2016 | Barwicz ............... G02B 6/1225 385/14 |
| 2018/0019216 A1* | 1/2018 | Hashemi .................. H01Q 9/42 |
| 2018/0122741 A1 | 5/2018 | Cho et al. |
| 2019/0115325 A1* | 4/2019 | Im ....................... H01L 23/3675 |
| 2019/0198437 A1* | 6/2019 | Kim ................... H01L 23/49811 |
| 2021/0066273 A1 | 3/2021 | Myasishchev et al. |

* cited by examiner

PRINTED CIRCUIT BOARD AND ELECTRONIC COMPONENT PACKAGE INCLUDING THE SAME

CROSS-REFERENCE TO RELATED APPLICATION(S)

This application claims benefit of priority to Korean Patent Application Nos. 10-2021-0042771 filed on Apr. 1, 2021 and 10-2021-0115617 filed on Aug. 31, 2021 in the Korean Intellectual Property Office, the entire disclosures of which are incorporated herein by reference for all purposes.

TECHNICAL FIELD

The present disclosure relates to a printed circuit board and an electronic component package including the same.

BACKGROUND

Recently, in accordance with improvements of electronic device functions, the number of input/output terminals of application processors (APs) and memories has gradually increased, and the miniaturization of packages has been continuously demanded. APs have been continuously developed in the form of a system on chip (SOC), and recently, sizes and thicknesses of electronic components tends to increase as functions thereof have expanded to a neural processing unit (NPU) and 5G modem function. Accordingly, in order to miniaturize and thin the package, a cavity or groove method of inserting the electronic component such as the AP into a substrate is required.

In accordance with slimming and lightening of electronic devices in the information technology (IT) field, including mobile phones, in order to meet technical demand for slimness and lightness of electronic devices, a technology of thinning a package including electronic components such as the APs and integrated circuits (ICs) has been required, and technologies related to printed circuit boards connected to the electronic components and having various structures and packages on which the electronic components are mounted have recently been developed.

SUMMARY

An aspect of the present disclosure may provide a printed circuit board advantageous in decreasing an overall thickness and miniaturizing a product, and an electronic component package including the same.

According to an aspect of the present disclosure, a printed circuit board may include: a first insulating layer; a first cavity disposed in one surface of the first insulating layer; a plurality of protrusion portions spaced apart from each other in the first cavity; and a first wiring layer embedded in the one surface of the first insulating layer.

According to another aspect of the present disclosure, an electronic component package may include: a first printed circuit board including an insulating layer, a first cavity disposed in one surface of the insulating layer, and a plurality of protrusion portions spaced apart from each other in the first cavity; a second printed circuit board disposed on one side of the first printed circuit board and having one surface on which the first printed circuit board is mounted; and an electronic component mounted on the one surface of the second printed circuit board. The one surface of the insulating layer of the first printed circuit board is in contact with the electronic component.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
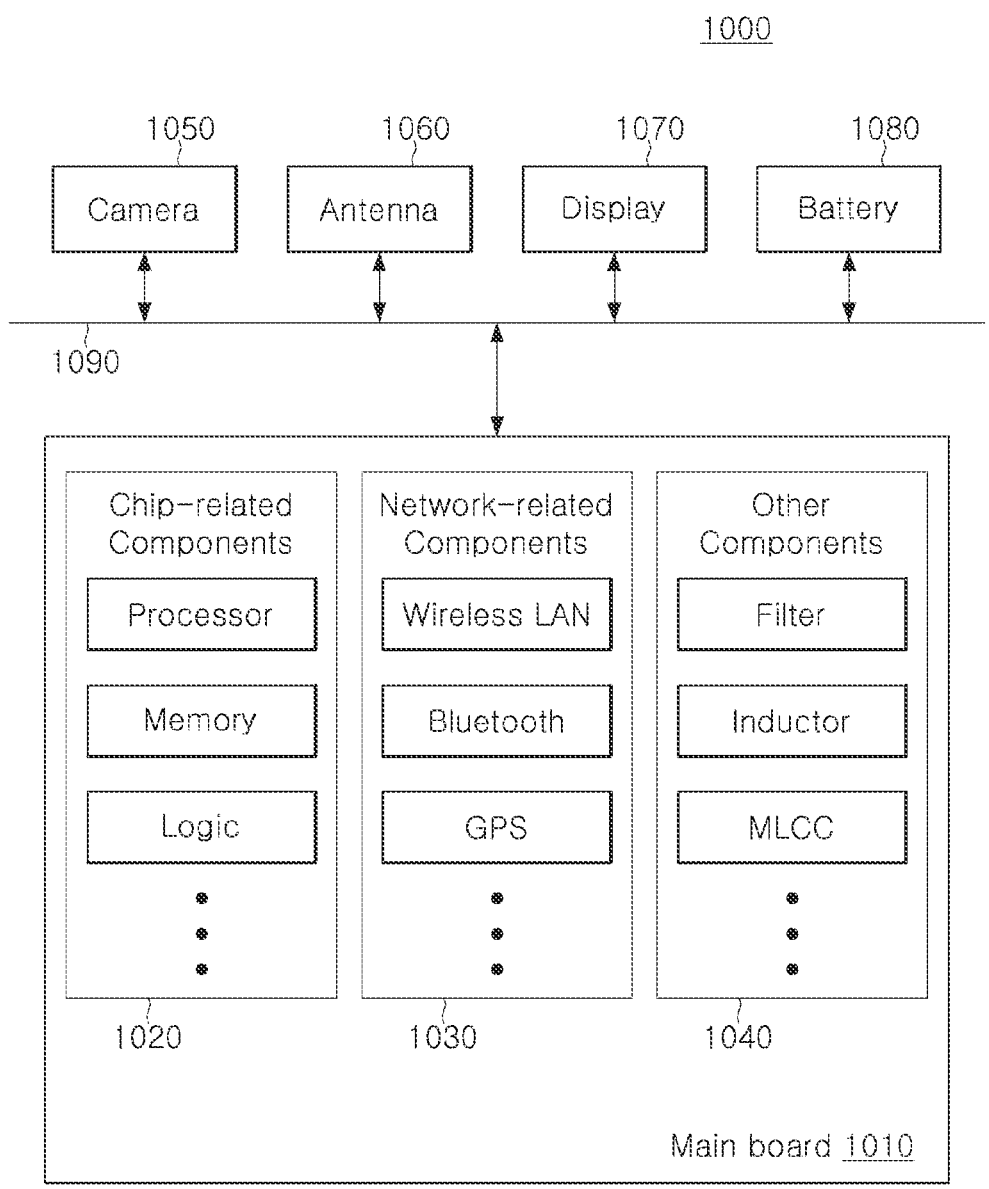
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

Herein, expressions such as a side portion and a side surface are used to refer to a left/right direction or a surface in the left/right direction in the drawings for convenience, expressions such as an upper side, an upper portion, and an upper surface are used to refer to an upward direction or a surface in the upward direction in the drawings for convenience, and expressions such as a lower side, a lower portion, and a lower surface are used to refer to a downward direction or a surface in the downward direction in the drawings for convenience. In addition, "positioned on the side portion, on the upper side, above, on the lower side, or below" conceptually includes a case in which a target component is positioned in a corresponding direction, but does not be in direct contact with a reference component, as well as a case in which the target component is in direct contact with the reference component in the corresponding direction. However, these directions are defined for convenience of explanation, and the claims are not particularly limited by the directions defined as described above, and concepts of upper and lower portions may be exchanged with each other at any time.

The meaning of a "connection" of a component to another component in the description conceptually includes an indirect connection through an adhesive layer as well as a direct connection between two components. In addition, "electrically connected" conceptually includes a physical connection and a physical disconnection. It may be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-digital converter (ADC), an application-specific integrated circuit (ASIC), or the like. However, these chip related components 1020 are not limited thereto, and may also include other types of chip related components. In addition, these chip related components may be combined with each other. These chip related components 1020 may have a package form including the chips described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, these network related components 1030 may be combined with the chip related components 1020 to be provided in a package form.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, but may also include chip component types of passive components used for various other purposes, or the like. In addition, these other components 1040 may be combined with the chip related components 1020 and/or the network related components 1030 to be provided in a package form.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
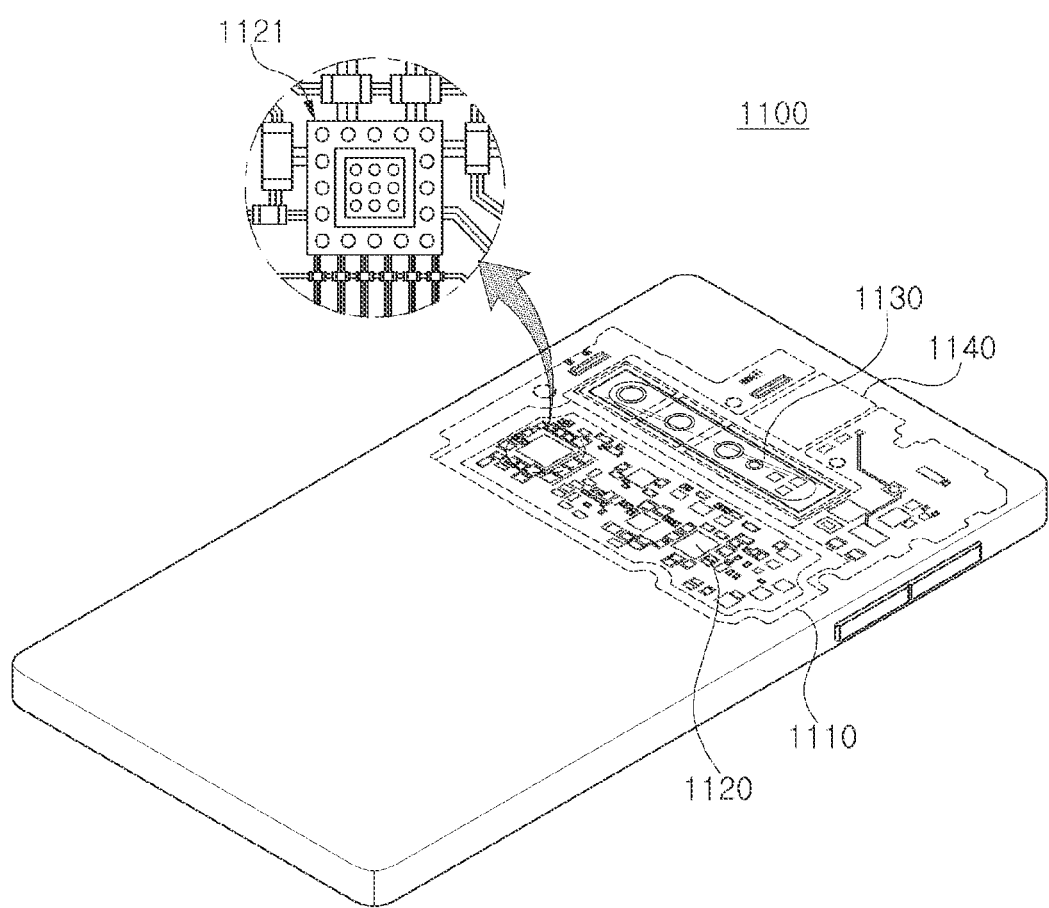
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A motherboard 1110 may be accommodated in the smartphone 1100, and various electronic components 1120 may be physically or electrically connected to the motherboard 1110. In addition, a camera module 1130 and/or a speaker 1140 may be accommodated in the motherboard 1110. Some of the electronic components 1120 may be the chip related components, for example, a printed circuit board 1121, but are not limited thereto. The printed circuit board 1121 may have a form in which electronic components are embedded in a multilayer printed circuit board, but is not limited thereto. Meanwhile, the electronic device is not necessarily limited to the smartphone 1100, but may be other electronic devices as described above.

Figure 3:
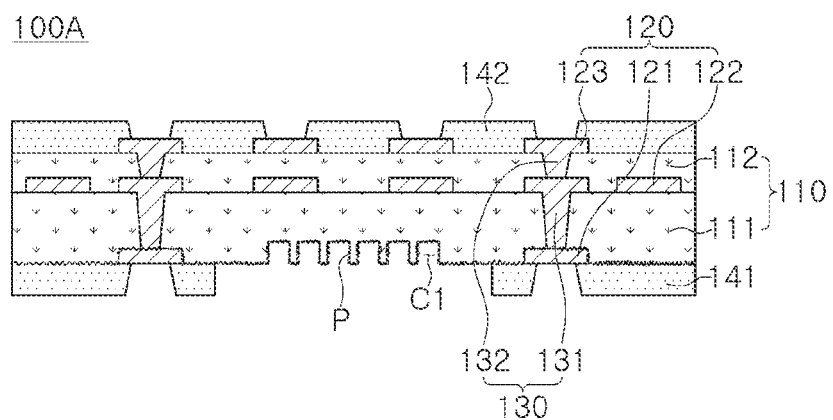
FIG. 3 is a schematic cross-sectional view illustrating an example of a printed circuit board.

FIG. 3 is a schematic cross-sectional view illustrating an example of a printed circuit board.

Referring to FIG. 3, a printed circuit board 100A according to an exemplary embodiment may include a first insulating layer 111 in which a first cavity C1 is formed, a plurality of protrusion portions P formed in the first cavity C1, a first wiring layer 121 embedded in one surface of the first insulating layer 111, a second wiring layer 122 disposed on the other surface of the first insulating layer 111, a first via layer 131 penetrating through at least a portion of the first insulating layer 111 and electrically connecting the first and second wiring layers 121 and 122 to each other, a second insulating layer 112 disposed on the other surface of the first insulating layer 111 to cover at least a portion of the second wiring layer 122, a third wiring layer 123 disposed on the second insulating layer 112, a second via layer 132 penetrating through at least a portion of the second insulating layer 112 and electrically connecting the second and third wiring layers 122 and 123 to each other, and first and second passivation layers 141 and 142 disposed on one surface of the first insulating layer 111 and the other surface of the second insulating layer 112, respectively.

For example, the printed circuit board 100A according to the exemplary embodiment may be an interposer substrate to be connected to an electronic component later. The printed circuit board 100A according to the exemplary embodiment may be manufactured so that the first cavity C1 is formed in one surface of the first insulating layer 111, and a plurality of protrusion portions P is disposed in the first cavity C1. In this case, when the printed circuit board 100A is bonded to the electronic component later, the electronic component may be more easily disposed, and the printed circuit board 100A may be stably bonded to the electronic component without damaging the electronic component.

Meanwhile, the first cavity C1 and the plurality of protrusion portions P of the printed circuit board 100A according to the exemplary embodiment may facilitate the bonding between the electronic component and the printed circuit board 100A as described above, and an encapsulant may be filled in the first cavity C1 to maintain a stable bonding structure. In this case, the first cavity C1 and the plurality of protrusion portions P may be formed by plating and removal of a second region M2 of a metal layer M as in a manufacturing process to be described later. Therefore, a separate process may not be required and the first cavity C1 and the plurality of protrusion portions P may be formed in a process of manufacturing the first wiring layer 121, and thus, a process may be simplified and a manufacturing cost may be reduced.

Meanwhile, the first cavity C1 and the plurality of protrusion portions P of the printed circuit board 100A according to the exemplary embodiment may be formed by the plating and the removal of the second region M2 of the metal layer M as in a manufacturing process to be described later. A high roughness may be formed on a surface of the second region M2 through roughening, and a high roughness may also be formed on an inner wall of the first cavity C1 formed by the removal of the second metal layer M2.

Meanwhile, the first wiring layer 121 of the printed circuit board 100A according to the exemplary embodiment may be formed by plating of a first region M1 of the metal layer M as in a manufacturing process to be described later. During a manufacturing process, a high roughness may be formed on a surface of the first region M1 through roughening, and thus, the first wiring layer 121 may have surfaces having different roughness. Specifically, a surface of the first wiring layer 121 in contact with the first insulating layer 111 may have a roughness relatively higher than that of a surface of the first wiring layer 121 exposed from the first insulating layer 111.

Components of the printed circuit board 100A according to the exemplary embodiment will hereinafter be described in more detail with reference to the drawings.

An insulating layer 110 may include the first and second insulating layers 111 and 112. The insulating layer 110 may further improve rigidity of the printed circuit board 100A depending on certain materials. The first cavity C1 may be formed in one surface of the insulating layer 110, and the plurality of protrusion portions P may be formed in the first cavity C1. The first cavity C1 may be a closed space of which all of four sides are blocked, but a discontinuous portion, for example, an externally open portion, may exist in a partial region of the first cavity C1, if necessary. If necessary, a plurality of first cavities C1 may exist. The plurality of protrusion portions P formed in the first cavity C1 may be disposed to be spaced apart from each other. An encapsulant 400 to be described later may be filled in the first cavity C1. That is, an encapsulant 400 to be described later may be disposed between the plurality of protrusion portions P in the first cavity C1.

A material of the insulating layer 110 may be an insulating material, for example, a thermosetting resin such as an epoxy resin or a thermoplastic resin such as polyimide. Alternatively, the material of the insulating layer 110 may be a material having an inorganic filler such as silica, a reinforcing material such as a glass fiber, and the like, included in the thermosetting resin and the thermoplastic resin. For example, the material of the insulating layer 110 may be prepreg, but is not limited thereto, and may be a material that does not include the reinforcing material such as the glass fiber, for example, Ajinomoto Build-up Film (ABF). The material of the insulating layer 110 may be a photosensitive insulating material such as a photoimagable dielectric (PID), if necessary. Referring to FIG. 3, it has been currently illustrated that the insulating layer 110 includes the first and second insulating layers 111 and 112, but the insulating layer 110 may also include more layers or fewer layers than those illustrated in FIG. 3.

Figure 4:
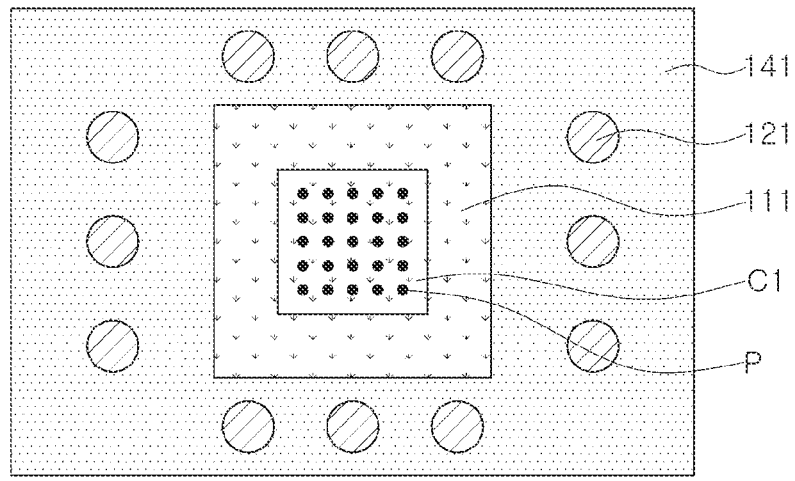
FIG. 4 is a schematic plan view illustrating one surface of the printed circuit board of FIG. 3.

FIG. 4 is a schematic plan view illustrating one surface of the printed circuit board of FIG. 3.

The plurality of protrusion portions P may be formed to be spaced apart from each other in the first cavity C1. The plurality of protrusion portions P may be formed on a lower surface of the first cavity C1, and may protrude from the lower surface of the first cavity C1 toward an inner portion of the first cavity C1. A height of the plurality of protrusion portions P may be substantially the same as a height of the first cavity C1. Therefore, one end of the plurality of protrusion portions P and one surface of the first insulating layer 111 may be coplanar with each other. The plurality of protrusion portions P may serve to support a component to be disposed in the first cavity C1 or on one surface of the first insulating layer 111 later, such as an electronic component. That is, since the plurality of protrusion portions P are disposed to protrude from the lower surface of the first cavity C1, when an electronic component to be described later is disposed on one surface of the first insulating layer 111, the electronic component may be spaced apart from the lower surface of the first cavity C1 by the height of the protrusion portions P, and the encapsulant 400 may be filled in a space between the electronic component and the lower surface of the first cavity C1 spaced apart from each other to secure adhesion of the electronic component. Since it is only required to dispose the printed circuit board on the electronic component until the electronic component comes into contact with the plurality of protrusion portions P without requiring processes such as distance measurement and equipment setting for spacing the electronic component and the lower surface of the first cavity C1 apart from each other, a process may be further simplified.

The first cavity C1 and the plurality of protrusion portions P may be formed by removal of the second region M2 of the metal layer M to be described later rather than laser processing or mechanical processing, and accordingly, a high roughness may be formed on the inner wall and the lower surface of the first cavity C1 and surfaces of the plurality of protrusion portions P through roughening during a manufacturing process to be described later. For example, the inner wall and lower surface of the first cavity C1 and the surfaces of the plurality of protrusion portions P may have a higher roughness than the surface of the first wiring layer 121 exposed from one surface of the first insulating layer 111. Since the high roughness is formed on the inner wall of the first cavity C1, when an encapsulant 400 to be described later is disposed in the first cavity C1, adhesion between the encapsulant 400 and the first cavity C1 may be improved.

A plurality of wiring layers 120 may include the first to third wiring layers 121, 122, and 123, may be configured to transfer signals of the printed circuit board 100A, and may be disposed on or between the insulating layers 110.

The first wiring layer 121 may be embedded in one surface of the first insulating layer 111, and at least a portion thereof may be exposed externally from the first insulating layer 111. Some surfaces of the first wiring layer 121 may have a slightly high roughness by performing roughening on the surface during a manufacturing process to be described later. For example, the surface of the first wiring layer 121 in contact with the first insulating layer 111 may have a roughness higher than that of the surface of the first wiring layer 121 exposed externally from the first insulating layer 111. As described above, the surface of the first wiring layer 121 in contact with the first insulating layer 111 may have the high roughness, and adhesion between the first wiring layer 121 and the first insulating layer 111 may thus be improved. Referring to FIG. 3, the first wiring layer 121 may be exposed externally from one surface of the first insulating layer 111 and may have a structure in which an exposed surface thereof is recessed inwardly of the printed circuit board 100A by a predetermined distance as compared with one surface of the first insulating layer 111 due to characteristics of an etching process. Although not illustrated, a surface treatment layer including at least one of nickel (Ni) and gold (Au) or an organic film through surface treatment such as organic solderability preservative (OSP) may be disposed on the surface of the first wiring layer 121 exposed from one surface of the first insulating layer 111 to protect the surface of the first wiring layer 121 from oxidation.

The second wiring layer 122 may be disposed on the other surface of the first insulating layer 111, and may have a structure in which the second wiring layer 122 is embedded from one surface of the second insulating layer 112 into the second insulating layer 112. The third wiring layer 123 may be disposed on the other surface of the second insulating layer 112.

A material of each of the first to third wiring layers 121, 122, and 123 may be a metal material such as copper (Cu), aluminum (Al), silver (Ag), tin (Sn), gold (Au), nickel (Ni), lead (Pb), titanium (Ti), or alloys thereof. The first to third wiring layers 121, 122, and 123 may perform various functions depending on their designs. For example, the first to third wiring layers 121, 122, and 123 may include ground patterns, power patterns, signal patterns, and the like. These patterns may have a line, plane, or pad form, respectively. The first wiring layer 121 may be formed by a plating process such as an additive process (AP), a semi-additive process (SAP), a modified semi-additive process (MSAP), or tenting (TT), and may resultantly include a seed layer, which is an electroless plating layer, and an electroplating layer formed on the basis of the seed layer. When the insulating layer 110 is provided in the form of resin coated copper (RCC), each of the first to third wiring layers 121, 122, and 123 may further include a metal foil such as a copper foil, and a primer resin may exist on a surface of the metal foil, if necessary. A wiring layer exposed from the outermost layer among the plurality of wiring layers 120 may function as a connection pad for connection with other substrates or components. For example, the first and third wiring layers 121 and 123 exposed from the outermost layer of the printed circuit board 100A of FIG. 3 may be connected to an electrical connection metal to be described later to function as a connection pad.

Referring to FIG. 3, only the first to third wiring layers 121, 122, and 123 are currently illustrated, but more wiring layers or fewer wiring layers than those illustrated in FIG. 3 may also be disposed.

A plurality of via layers 130 may include the first and second via layers 131 and 132. The plurality of via layers 130 may include the first via layer 131 penetrating through the first insulating layer 111 and electrically connecting the first and second wiring layers 121 and 121 to each other and the second via layer 131 penetrating through the second insulating layer 112 and electrically connecting the second and third wiring layers 122 and 123 to each other. A material of each of the first and second via layers 131 and 132 may be a metal material such as copper (Cu), aluminum (Al), silver (Ag), tin (Sn), gold (Au), nickel (Ni), lead (Pb), titanium (Ti), or alloys thereof. The first and second via layers 131 and 132 may include signal vias, ground vias, power vias, and the like, depending on their designs. Each of vias of the first and second via layers 131 and 132 may be formed by completely filling each of via holes with a metal material or be formed by forming the metal material along a wall of each of via holes. Each of the first and second via layers 131 and 132 may also be formed by a process such as an AP, an SAP, a MSAP, or TT, and may include a seed layer, which is an electroless plating layer, and an electroplating layer formed on the basis of the seed layer. Each of the vias of the first and second via layers 131 and 132 may have a tapered shape of which a width of an upper surface is greater than a width of a lower surface.

Meanwhile, only the first and second via layers 131 and 132 have been illustrated in FIG. 3, but more or fewer via layers may be disposed, if necessary.

The first and second passivation layers 141 and 142 may protect internal components from external physical or chemical damage. The first and second passivation layers 141 and 142 may have a plurality of first and second openings, respectively. Each of the plurality of first openings may expose at least a portion of the first wiring layer 121 and at least a portion of the first insulating layer 111. Each of the plurality of second openings may expose at least a portion of the third wiring layer 123. A material of the first and second passivation layers 141 and 142 may be an insulating material, for example, a thermosetting resin such as an epoxy resin, a thermoplastic resin such as polyimide, or mixtures of the thermosetting resin and the thermoplastic resin with an inorganic filler, for example, ABF, but is not limited thereto.

Figure 5:
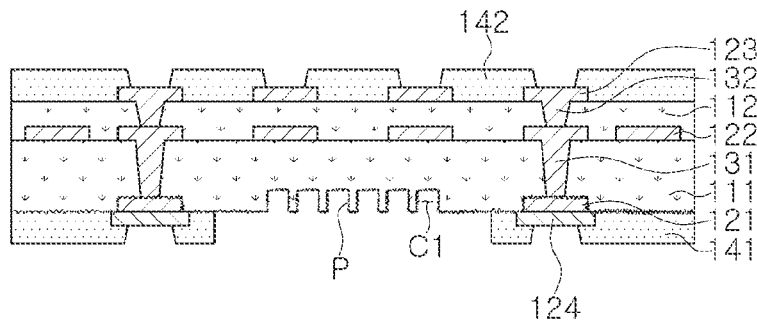
FIG. 5 is a schematic cross-sectional view illustrating another example of a printed circuit board.

FIG. 5 is a schematic cross-sectional view illustrating another example of a printed circuit board.

A printed circuit board 100B according to another exemplary embodiment illustrated FIG. 5 is different from the printed circuit board 100A according to the exemplary embodiment described above in that a fourth wiring layer 124 is disposed on the first insulating layer 111 and the first wiring layer 121. In this case, the fourth wiring layer 124 may be disposed on the exposed surface of the first wiring layer 121, and the first wiring layer 121 may be covered by the first insulating layer 111 and the fourth wiring layer 124.

In addition, at least a portion of the fourth wiring layer 124 may be exposed through the first opening of the first passivation layer 141. The fourth wiring layer 124 exposed through the first opening may function as a connection pad.

The fourth wiring layer 124 may include the metal material used as the material of each of the first to third wiring layers 121, 122, and 123, and may be disposed through a process such as an AP, an SAP, a MSAP, or TT. The fourth wiring layer 124 may be in contact with the first wiring layer 121 and may have a width greater than that of the first wiring layer 121. That is, when viewed from a stacked direction of the printed circuit board 100B, the fourth wiring layer 124 may be disposed so that a cross section thereof includes a cross section of the first wiring layer 121. Therefore, the connection pad may have a greater area, such that electrical connection with other components may be easier.

Meanwhile, as described above, the high roughness may be formed on the surface of the first wiring layer 121 in contact with the first insulating layer 111 through the roughening, and thus, the surface of the first wiring layer 121 in contact with the first insulating layer 111 may have a roughness higher than that of a surface of the first wiring layer 121 in contact with the fourth wiring layer 124.

A description of other configurations overlaps that described above in the printed circuit board 100A according to the exemplary embodiment, and is thus omitted.

Figure 6:
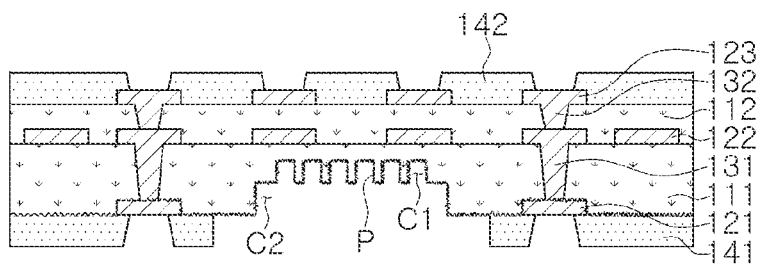
FIG. 6 is a schematic cross-sectional view illustrating another example of a printed circuit board.

FIG. 6 is a schematic cross-sectional view illustrating another example of a printed circuit board.

Figure 7:
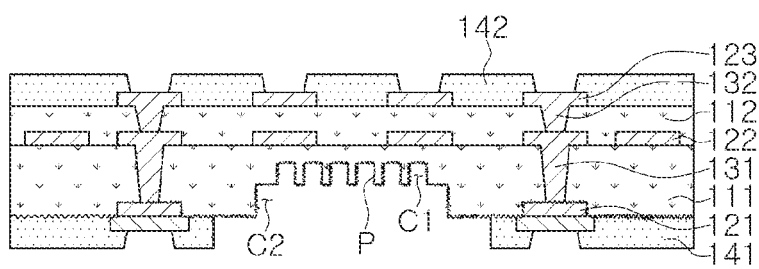
FIG. 7 is a schematic cross-sectional view illustrating another example of a printed circuit board.

FIG. 7 is a schematic cross-sectional view illustrating another example of a printed circuit board.

Printed circuit boards 100C and 100D according to other exemplary embodiments illustrated in FIGS. 6 and 7 are different from the printed circuit boards 100A and 100B according to the exemplary embodiment and another exemplary embodiment described above in that a second cavity C2 is additionally formed in one surface of the first insulating layer 111. In this case, the first cavity C1 may be formed on a lower surface of the second cavity C2.

In the printed circuit board 100C according to another exemplary embodiment illustrated in FIG. 6, the second cavity C2 may be manufactured by a process to be described later, and may be formed particularly by removal of a second region M2 of a metal layer M rather than laser processing or mechanical processing, and thus, a roughness formed on a surface of the second region M2 may be maintained on the lower surface and an inner wall of the second cavity C2 as it is. The lower surface and inner wall of the second cavity C2 may maintain the high roughness as described above, such that high adhesion with a component such as an encapsulant 400 in contact with the lower surface and inner wall of the second cavity C2 may be secured later.

The first cavity C1 may be formed on the lower surface of the second cavity C2, and as described above, the plurality of protrusion portions P may be formed to be spaced apart from each other in the first cavity C1. The lower surface and inner wall of the first cavity C1 and the surfaces of the plurality of protrusion portions P may also maintain a high roughness, similar to the lower surface and inner wall of the second cavity C2.

Referring to FIG. 7, the printed circuit board 100D according to another exemplary embodiment in which the second cavity C2 is formed and the above-described fourth wiring layer 124 is additionally disposed is disclosed.

A description of other configurations overlaps that described above in the printed circuit board 100A according to the exemplary embodiment, and is thus omitted.

Figure 8:
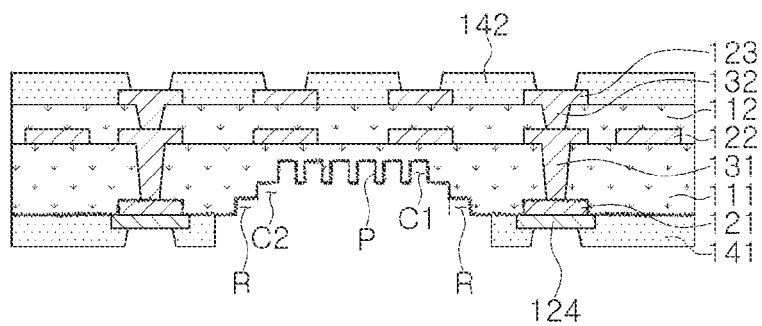
FIG. 8 is a schematic cross-sectional view illustrating another example of a printed circuit board.

FIG. 8 is a schematic cross-sectional view illustrating another example of a printed circuit board.

A printed circuit board 100E according to another exemplary embodiment illustrated in FIG. 8 is different from the printed circuit board 100D according to another exemplary embodiment described above in that a groove part R is additionally formed on a side surface of the second cavity C2.

The groove part R may be formed on the side surface of the second cavity C2. The groove part R may also be formed through removal of the second region M2 of the metal layer M, similar to the first and second cavities C1 and C2 described above, and a high roughness may thus be formed on a lower surface and an inner wall of the groove part R, such that adhesion with the encapsulant 400 may be secured.

Meanwhile, the groove part R may be formed on the side surface of the second cavity C2, and the side surface of the second cavity C2 may thus have a step. Since the second cavity C2 has the step as described above, a bonding area with a component disposed in the second cavity C2 later, for example, the encapsulant 400 may be increased, and adhesion between the second cavity C2 and a component inside the second cavity C2 may be improved due to an anchor effect of a step structure.

FIGS. 9 through 14 are schematic cross-sectional views illustrating an example of processes of manufacturing the printed circuit board of FIG. 3.

Figure 9:
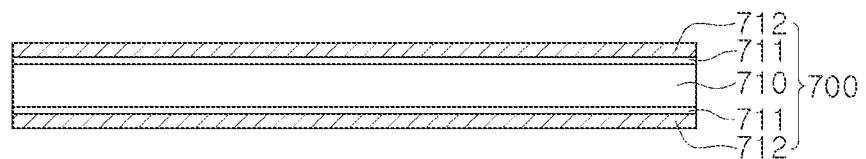
FIGS. 9 through 14 are schematic cross-sectional views illustrating an example of processes of manufacturing the printed circuit board of FIG. 3.

Referring to FIG. 9, a carrier 700 may be prepared. The carrier 700 may include a core 710 and first and second copper foils 711 and 712.

Figure 10:
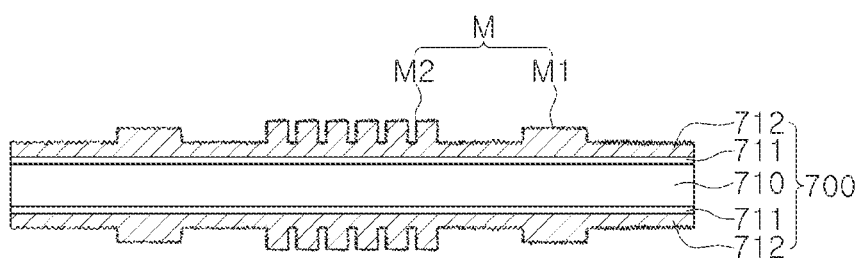

Referring to FIG. 10, metal layers M may be disposed on the second copper foils 712, and may be patterned and divided into first and second regions M1 and M2. In this case, the first region M1 may have a shape of a wiring layer surrounding the second region M2.

Thereafter, a high roughness may be formed on a surface of the patterned metal layer M through roughening such as black oxide. In this case, a high roughness may be formed on surfaces of the second copper foils 712 exposed through the patterning of the metal layers M as well as surfaces of the first and second regions M1 and M2 through roughening.

Figure 11:
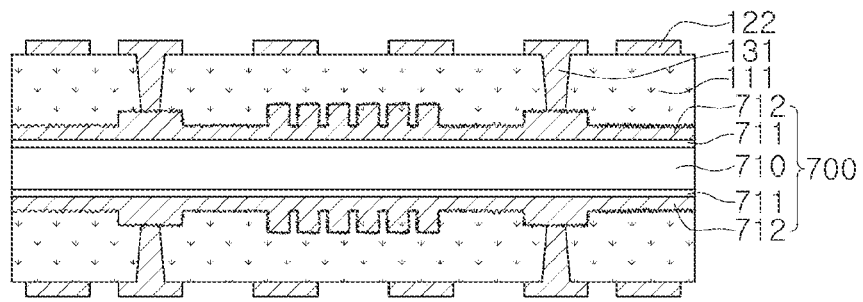
Figure 12:
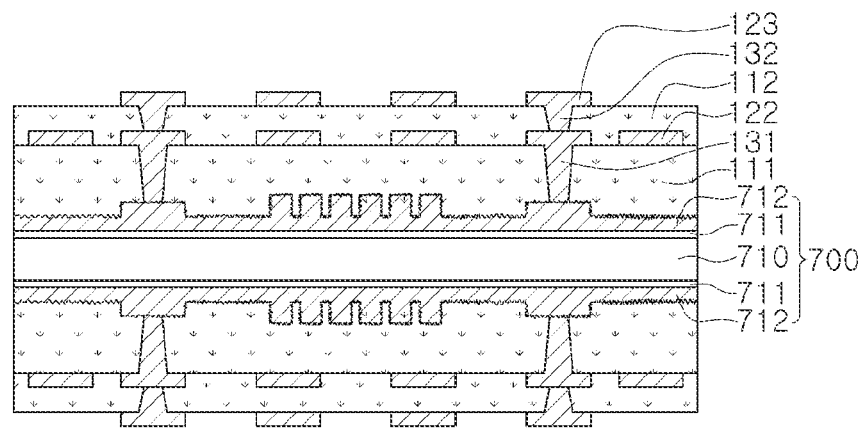

Referring to FIGS. 11 and 12, first insulating layers 111 may be stacked on the metal layers M, and second wiring layers 122 and first via layers 131 may be disposed. Thereafter, second insulating layers 112 covering the second wiring layers 122 may be stacked, and third wiring layers 123 and second via layers 132 may be disposed.

Figure 13:
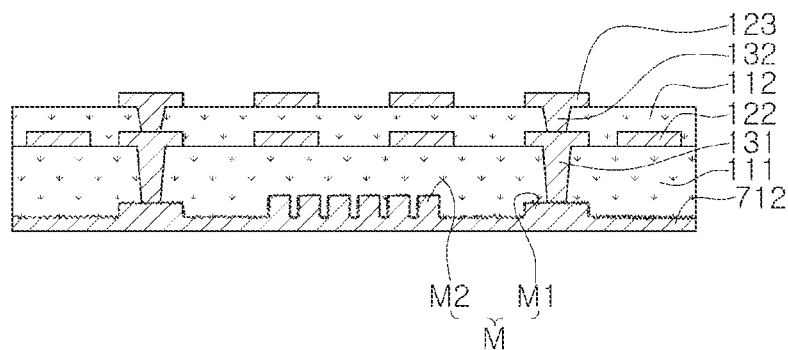

Referring to FIG. 13, the first and second copper foils 711 and 712 may be separated from each other, such that a portion of the carrier 700 may be removed.

Thereafter, the exposed second copper foil 712 may be first etched and removed. The second copper foil 712 is etched, such that the first wiring layer 121 may be completed. In this case, due to an influence of an etching process of the second copper foil 712, a lower surface of the first wiring layer 121 may also be slightly removed, such that the first wiring layer 121 may have a structure in which the lower surface thereof is recessed by a predetermined distance as compared with one surface of the first insulating layer 111.

Figure 14:
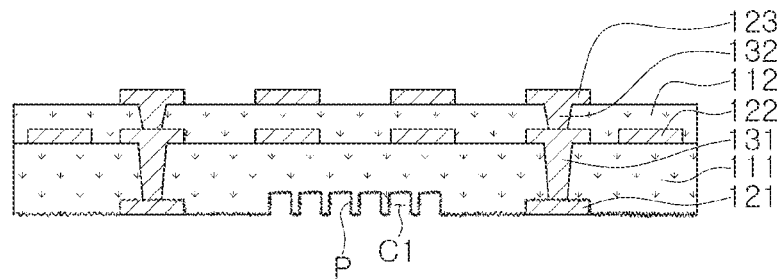

Next, as illustrated in FIG. 14, a mask may be disposed on the first wiring layer 121, and the second region M2 of the metal layer M may then be additionally etched and removed. Thereafter, the mask may be separated, and through the removal of the second region M2, the first cavity C1 may be formed in one surface of the first insulating layer 111 and the plurality of protrusion portions P protruding from a lower surface of the first cavity C1 may be disposed on the lower surface of the first cavity C1. The same roughness as the surface of the second region M2 of the metal layer M may be formed on the inner wall and the lower surface of the first cavity C1 and the surfaces of the plurality of protrusion portions P.

Thereafter, the printed circuit board of FIG. 3 may be manufactured by disposing the first and second passivation layers 141 and 142.

Figure 15:
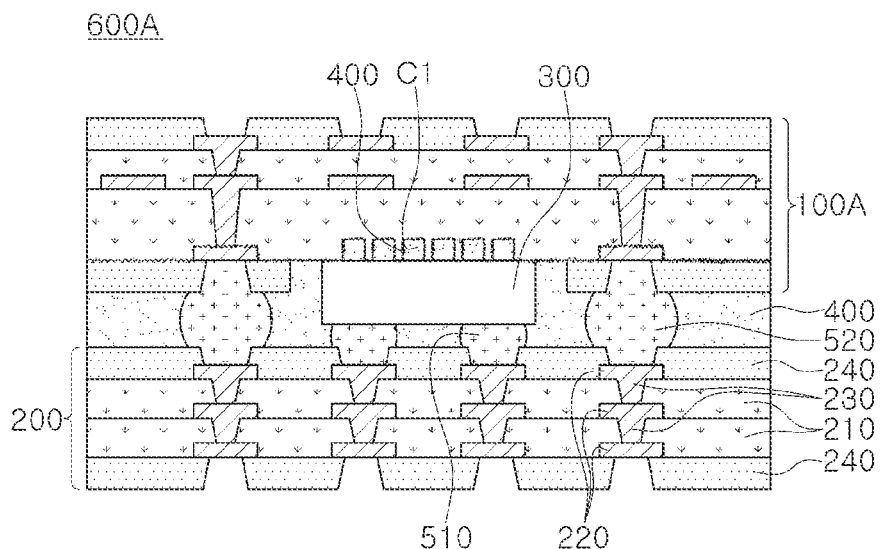
FIG. 15 is a schematic cross-sectional view illustrating an example of an electronic component package.

FIG. 15 is a schematic cross-sectional view illustrating an example of an electronic component package.

An electronic component package 600A according to an exemplary embodiment illustrated in FIG. 15 may include the printed circuit board 100A according to the exemplary embodiment described above. In the following description for the electronic component package 600A, a first printed circuit board 100A refers to the printed circuit board 100A according to the exemplary embodiment described above.

A description for the first printed circuit board 100A may overlap that described above in the printed circuit board 100A according to the exemplary embodiment.

The electronic component package 600A according to the exemplary embodiment illustrated in FIG. 15 may include the first printed circuit board 100A, a second printed circuit board 200 connected to the first printed circuit board 100A, an electronic component 300 mounted on the second printed circuit board 200, first electrical connection metals 510 electrically connecting the second printed circuit board 200 and the electronic component 300 to each other, second electrical connection metals 520 electrically connecting the first and second printed circuit boards 100A and 200 to each other, a plurality of protrusion portions P disposed in a first cavity C1, and an encapsulant 400 disposed between the first and second printed circuit boards 100A and 200 to fill the first cavity C1 and covering at least a portion of the electronic component 300.

The second printed circuit board 200 may be a printed circuit board on which the electronic component 300 is mounted, and may include build-up insulating layers 210, build-up wiring layers 220, build-up via layers 230, and a third passivation layer 240.

The build-up wiring layers 220 may be disposed outside or inside the build-up insulating layers 210, and the build-up via layers 230 may penetrate at least portions of the build-up insulating layers 210 and electrically connect the build-up wiring layers 220 disposed on different layers to each other. The third passivation layer 240 is disposed on an outer layer of the build-up insulating layer 210 and may have openings exposing portions of the build-up wiring layer 220.

A material of the build-up insulating layer 210 may be an insulating material, for example, a thermosetting resin such as an epoxy resin or a thermoplastic resin such as polyimide. Alternatively, the material of the build-up insulating layer 210 may be a material having an inorganic filler such as silica, a reinforcing material such as a glass fiber, and the like, included in the thermosetting resin and the thermoplastic resin. For example, the material of the build-up insulating layer 210 may be prepreg, but is not limited thereto, and may be a material that does not include the reinforcing material such as the glass fiber, for example, ABF. The material of the build-up insulating layer 210 may be a photosensitive insulating material such as a PID, if necessary. The build-up insulating layers 210 may include more layers or fewer layers than those illustrated in FIG. 15.

A material of each of the build-up wiring layers 220 may be a metal material such as copper (Cu), aluminum (Al), silver (Ag), tin (Sn), gold (Au), nickel (Ni), lead (Pb), titanium (Ti), or alloys thereof. The build-up wiring layers 220 may perform various functions depending on their designs. For example, the build-up wiring layers 220 may include ground patterns, power patterns, signal patterns, and the like. These patterns may have a line, plane, or pad form, respectively. Each of the build-up wiring layers 220 may also be formed by a plating process such as an AP, an SAP, an MSAP, TT, or the like, and may resultantly include a seed layer, which is an electroless plating layer, and an electroplating layer formed on the basis of the seed layer. When the build-up insulating layer 210 is provided in the form of RCC, the build-up wiring layer 220 may further include a metal foil such as a copper foil, and a primer resin may exist on a surface of the metal foil, if necessary. A wiring layer exposed from the outermost layer among the build-up wiring layers 220 may function as a connection pad for connection with other substrates or components. For example, the build-up wiring layer 220 exposed from the outermost layer of the second printed circuit board 200 of FIG. 15 may be connected to first and second electrical connection metals 510 and 520 to be described later to function as a connection pad.

The build-up wiring layers 220 may include more layers or fewer layers than those illustrated in FIG. 15.

A material of each of the build-up via layers 230 may be a metal material such as copper (Cu), aluminum (Al), silver (Ag), tin (Sn), gold (Au), nickel (Ni), lead (Pb), titanium (Ti), or alloys thereof. The build-up via layers 230 may include signal vias, ground vias, power vias, and the like, depending on their designs. Each of vias of the build-up via layers 230 may be formed by completely filling each of via holes with the metal material or be formed by forming the metal material along a wall of each of via holes. Each of the build-up via layers 230 may also be formed by a process such as an AP, an SAP, a MSAP, TT, or the like, and may include a seed layer, which is an electroless plating layer, and an electroplating layer formed on the basis of the seed layer. Each of the vias of the build-up via layers 230 may also have a tapered shape of which a width of an upper surface is greater than that of a lower surface.

The build-up via layers 230 may include more layers or fewer layers than those illustrated in FIG. 15, if necessary.

The electronic component 300 may be an integrated circuit (IC) die provided in an amount of several hundred to several million or more elements integrated in a single chip. The electronic component 300 may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, or a micro controller, but is not limited thereto. In addition, the electronic component 300 may be a memory such as a volatile memory (for example, a DRAM), a non-volatile memory (for example, a ROM), or a flash memory, or a logic such as an analog-to-digital converter or an application-specific IC (ASIC). If necessary, the electronic component 300 may be a chip-type passive component, for example, a chip-type capacitor such as a multilayer ceramic capacitor (MLCC) or a chip-type inductor such as a power inductor (PI). The electronic component 300 may be disposed so that a surface thereof on which connection pads (not illustrated) are disposed faces downward, and an opposite surface thereof faces upward. The connection pads of the electronic component 300 may include a metal material such as copper (Cu) or aluminum (Al), and may be connected to the first electrical connection metals 510. The electronic component 300 may be covered by the encapsulant 400 without a separate adhesive film, and resultantly, a back surface and side surfaces of the electronic component 300 may be in physical contact with the encapsulant 400.

With the electronic component package 600A according to the exemplary embodiment, the electronic component 300 may be in contact with one surface of the first insulating layer 111 of the first printed circuit board 100A. At least portions of the first insulating layer 111 may be exposed from the first passivation layer 141 through the first openings, and the electronic component 300 may be disposed to be in contact with the exposed one surface of the first insulating layer 111. In addition, the first cavity C1 may be formed in a region where the electronic component 300 and the first insulating layer 111 are in contact with each other. Since the first insulating layer 111 and the electronic component 400 are in contact with each other as described above, when the first printed circuit board 100A is stacked on the second printed circuit board 200, separate distance measurement or a fine control process may not be required.

Specifically, when an electronic component is disposed in a separate accommodation space or cavity in the related art, a predetermined spaced distance needs to be secured between the electronic component and the accommodation space in order to secure a space in which an encapsulant is to be disposed between the electronic component and the accommodation space, and a fine substrate disposing process for securing such a spaced distance is required. Accordingly, a defect in fixing the electronic component, damage to the electronic component, and the like, may occur due to a failure in adjusting a substrate distance, or the like.

On the other hand, with the electronic component package 600A according to the exemplary embodiment, the first cavity C1 may be formed in one surface of the first insulating layer 111 in advance, the plurality of protrusion portions P protruding from the lower surface of the first cavity C1 may be formed in advance, and the plurality of protrusion portions P may allow the electronic component 300 to be spaced apart from the lower surface of the first cavity C1 by a predetermined distance, such that a space in which the encapsulant 400 may be filled may be sufficiently secured. Accordingly, the encapsulant 400 may be filled in the first cavity C1 even though the first insulating layer 111 and the electronic component 300 are in contact with each other. That is, the encapsulant 400 may fill a space between the plurality of protrusion portions P or a space between the plurality of protrusion portions P and the inner wall of the first cavity C1. Accordingly, a spaced distance between the electronic component 300 and the first insulating layer 111 does not need to be secured, and thus, a device and a process used for measuring the spaced distance and maintaining a spaced state may be omitted, such that a process may be simplified and a manufacturing cost may be reduced.

Meanwhile, when the first printed circuit board 100A is stacked on the electronic component 300, the plurality of protrusion portions P may function as a support between the electronic component 300 and the first printed circuit board 100A, and may thus be in contact with an upper surface of the electronic component 300.

The encapsulant 400 may be disposed on one surface of the first insulating layer 111, and may cover at least portions of one surface of the first insulating layer 111, an upper surface of the second printed circuit board 200, and an outer surface of the electronic component 300. In addition, the encapsulant 400 may fill at least a portion of the first cavity C1, and may resultantly cover at least portions of the upper surface of the electronic component 300. For example, the encapsulant 400 may be in physical contact with at least portions of each of the upper surface, a lower surface, and the side surfaces of the electronic component 300. The encapsulant 400 may have fluidity in a B-stage, and thus flow along the outer surface of the electronic component 300 and the surface of the first insulating layer 111. In this case, since the first cavity C1 is formed in the first insulating layer 111, the encapsulant 400 may fill an inner portion of the first cavity C1, and accordingly, adhesion between the electronic component 300 and the first insulating layer 111 of the first printed circuit board 100A may be secured. The encapsulant 400 may fill the first cavity C1 and be in contact with at least portions of the upper surface of the electronic component 300, such that the electronic component 300 may be more stably fixed.

In addition, since the high roughness is formed on one surface of the first insulating layer 111, the inner wall and lower surface of the first cavity C1, and the surfaces of the plurality of protrusion portions P through the roughening, as described above, sufficient adhesion between the encapsulant 400 and the first insulating layer 111 may be ensured, and a more stable package structure may thus be completed.

A material of the encapsulant 400 may be an insulating material, for example, may be a thermosetting resin such as an epoxy resin or a thermoplastic resin such as polyimide. Alternatively, the material of the encapsulant 400 may be a material having an inorganic filler such as silica included in the thermosetting resin and the thermoplastic resin. For example, the material of the encapsulant 400 may be ABF. The ABF may be provided in the form of a resin coated copper (RCC), but is not limited thereto. The material of the encapsulant 400 may be photosensitive material such as PID, if necessary. The material of the encapsulant 400 may be a known epoxy molding compound (EMC), but is not limited thereto.

The first and second electrical connection metals 510 and 520 may be disposed in at least some of the openings of the third passivation layer 240. The first and second electrical connection metals 510 and 520 may physically and/or electrically externally connect the second printed circuit board 200. For example, the first electrical connection metals 510 may electrically connect the exposed build-up wiring layer 220 and the electronic component 300 to each other, and the second electrical connection metals 520 may electrically connect the exposed build-up wiring layer 220 and the first wiring layer 121 to each other. Each of the first and second electrical connection metals 510 and 520 may be formed of tin (Sn) or an alloy containing tin (Sn), for example, solder, but is not limited thereto. Each of the first and second electrical connection metals 510 and 520 may be a metal post having a land, ball, pin, or column shape.

In the electronic component package 600A according to the exemplary embodiment, the second electrical connection metal 520 may have a greater volume than the first electrical connection metal 510. Meanwhile, since the electronic component 300 is in contact with one surface of the first insulating layer 111, a thickness of the second electrical connection metal 520 in a stacked direction of the electronic component package 600A may be substantially the same as the sum of thicknesses of the electronic component 300 and the first electrical connection metal 510 in the stacked direction.

Here, a phrase "substantially the same" does not mean that thicknesses are not completely the same as each other numerically, but is a meaning comprehensively including the meaning of equal thicknesses including errors in a process, or the like.

In the description for the electronic component package 600A, a description for the printed circuit board 100A overlaps that described above in the first printed circuit board 100A according to the exemplary embodiment.

Figure 16:
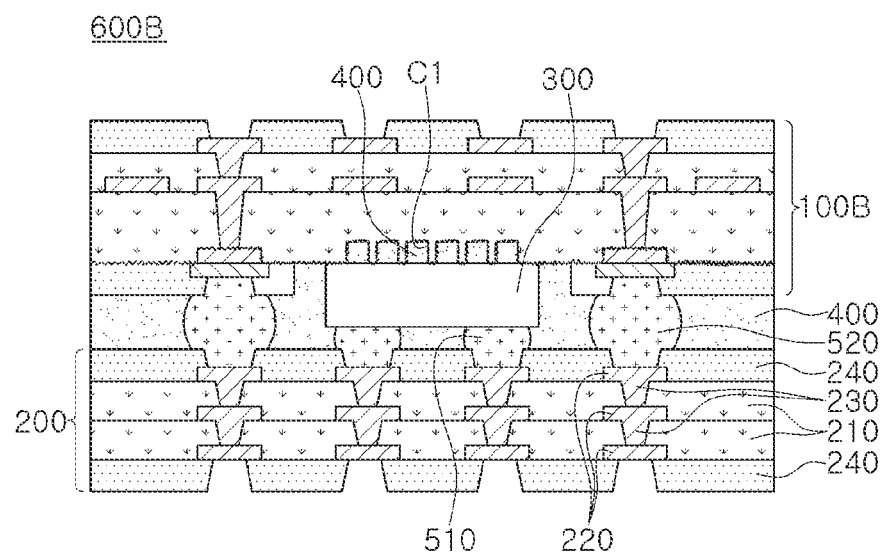
FIG. 16 is a schematic cross-sectional view illustrating another example of an electronic component package.

FIG. 16 is a schematic cross-sectional view illustrating another example of an electronic component package.

An electronic component package 600B according to another exemplary embodiment illustrated in FIG. 16 is different in a structure of a first printed circuit board 100B from the electronic component package 600A according to the exemplary embodiment described above.

Referring to FIG. 16, a first printed circuit board 100B mounted on the second printed circuit board 200 of the electronic component package 600B according to another exemplary embodiment may be the printed circuit board 100B according to another exemplary embodiment described above.

Accordingly, a fourth wiring layer 124 having a width greater than that of the first wiring layer 121 may be additionally disposed on the first wiring layer 121.

Since the fourth wiring layer 124 is disposed, in the electronic component package 600B according to another exemplary embodiment, a volume of the second electrical connection metal 520 may become relatively small. The second electrical connection metal 520 may be formed to have a smaller size, such that the electronic component package 600B according to another exemplary embodiment may be implemented in a finer structure in terms of mounting. In addition, in the electronic component package 600B according to another exemplary embodiment, the volume of the second electrical connection metal 520 may become small, which is advantageous in that a short-circuit between the second electrical connection metals 520 or between the second electrical connection metal 520 and the first electrical connection metal 510 may be prevented.

A description for other components overlaps that described above in the electronic component package 600A according to the exemplary embodiment and the printed circuit board 100B according to another exemplary embodiment, and is thus omitted.

Figure 17:
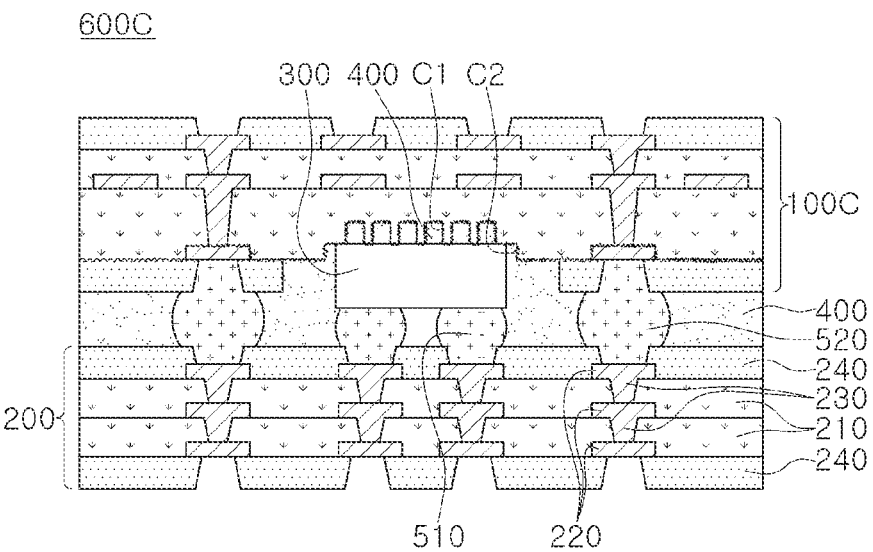
FIG. 17 is a schematic cross-sectional view illustrating another example of an electronic component package.

FIG. 17 is a schematic cross-sectional view illustrating another example of an electronic component package.

An electronic component package 600C according to another exemplary embodiment illustrated in FIG. 17 is different in terms of a structure of a first printed circuit board 100C from the electronic component package 600A according to the exemplary embodiment described above.

Referring to FIG. 17, a first printed circuit board 100C mounted on the second printed circuit board 200 of the electronic component package 600C according to another exemplary embodiment may be the printed circuit board 100C according to another exemplary embodiment described above.

Accordingly, the second cavity C2 may be formed in one surface of the first insulating layer 111 of the first printed circuit board 100C, and the first cavity C1 may be formed on the lower surface of the second cavity C2.

Referring to FIG. 17, a width of the second cavity C2 may be greater than that of the electronic component 300. Accordingly, when the electronic component 300 and the first printed circuit board 100C are mounted on the second printed circuit board 200, at least a portion of the electronic component 300 may be disposed inside the second cavity C2. In addition, the width of the second cavity C2 may be greater than that of the first cavity C1. An upper surface of the electronic component 300 disposed in the second cavity C2 may be in contact with the lower surface of the second cavity C2, and may be in contact with the plurality of protrusion portions P disposed in the first cavity C1. In addition, since the width of the second cavity C2 is greater than that of the electronic component 300, when the encapsulant 400 fills an inner portion of the second cavity C2, the encapsulant 400 may cover at least portions of the upper surface and side surfaces of the electronic component 300. Since the encapsulant 400 may cover at least a portion of each of the upper surface and the side surfaces of the electronic component 300, the electronic component 300 may be stably bonded and fixed. In addition, since a space in which the encapsulant 400 is to be disposed is secured by the plurality of protrusion portions P formed in the first cavity C1, a process and a cost for securing a distance between the lower surface of the second cavity C2 and the electronic component 300 may not be consumed, which is advantageous in that there is an effect of improving a yield and reducing a cost.

Meanwhile, the second cavity C2 may also have a high roughness formed on an inner wall and the lower surface thereof through roughening, similar to the first cavity C1 described above. Therefore, high adhesion between the encapsulant 400 and the first insulating layer 111 may be secured.

A description for other components overlaps that described above in the electronic component package 600A according to the exemplary embodiment and the printed circuit board 100C according to another exemplary embodiment, and is thus omitted.

Figure 18:
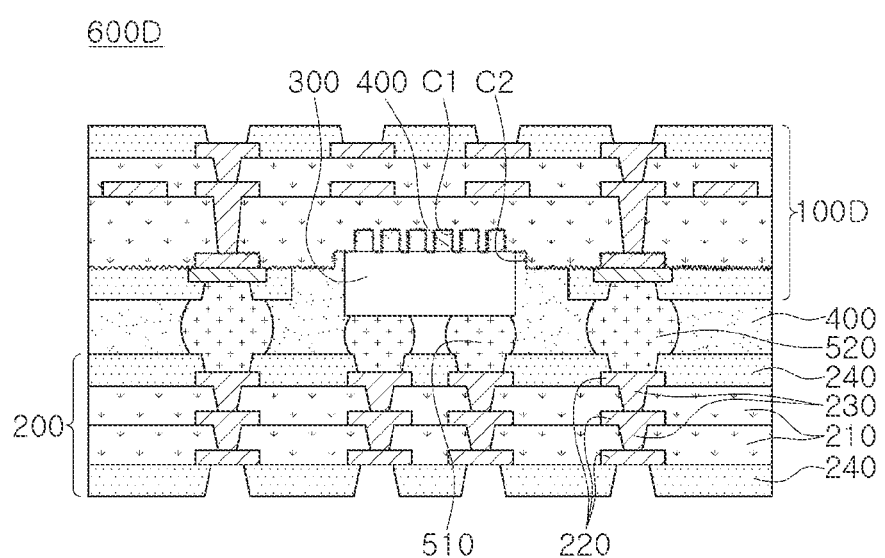
FIG. 18 is a schematic cross-sectional view illustrating another example of an electronic component package.

FIG. 18 is a schematic cross-sectional view illustrating another example of an electronic component package.

An electronic component package 600D according to another exemplary embodiment illustrated in FIG. 18 is different in a structure of a first printed circuit board 100D from the electronic component package 600C according to another exemplary embodiment described above.

Referring to FIG. 18, a first printed circuit board 100D mounted on the second printed circuit board 200 of the electronic component package 600D according to another exemplary embodiment may be the printed circuit board 100D according to another exemplary embodiment described above.

Accordingly, the first printed circuit board 100D of the electronic component package 600D according to another exemplary embodiment illustrated in FIG. 18 may further include a fourth wiring layer 124 disposed on the first wiring layer 121, and a second cavity C2 may be formed in one surface of the first insulating layer 111.

A description for other components of the electronic component package 600D according to another exemplary embodiment illustrated in FIG. 18 overlaps that described above in the first printed circuit board 100D according to the exemplary embodiment and the electronic component packages 600B and 600C according to another exemplary embodiment.

Figure 19:
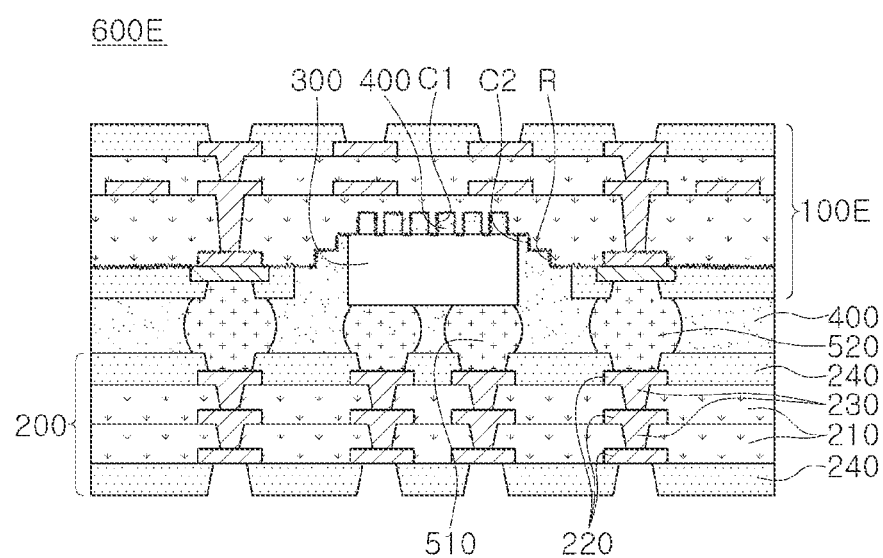
FIG. 19 is a cross-sectional view schematically illustrating another example of an electronic component package.

FIG. 19 is a cross-sectional view schematically illustrating another example of an electronic component package.

An electronic component package 600E according to another exemplary embodiment illustrated in FIG. 19 is different in a structure of a first printed circuit board 100E from the electronic component package 600D according to another exemplary embodiment described above.

Referring to FIG. 19, a first printed circuit board 100E mounted on the second printed circuit board 200 of the electronic component package 600E according to another exemplary embodiment may be the printed circuit board 100E according to another exemplary embodiment described above.

Accordingly, a groove part R may be formed on a side surface of the second cavity C2 formed in the first insulating layer 111 of the first printed circuit board 100E, and accordingly, the side surface of the second cavity C2 may have a step.

Since the side surface of the second cavity C2 has the step, the encapsulant 400 may also be filled in the groove part R, and adhesion between the encapsulant 400 and the first insulating layer 111 may be further improved due to an anchor effect of a step structure, or the like.

Meanwhile, the groove part R may also have a high roughness formed on an inner wall and a lower surface thereof through roughening, similar to the first cavity C1 and the second cavity C2 described above. Therefore, high adhesion between the encapsulant 400 and the first insulating layer 111 may be secured.

A description for other components overlaps that described above in the printed circuit board 100E according to another exemplary embodiment and the electronic component package 600D according to another exemplary embodiment, and is thus omitted.

As set forth above, according to an exemplary embodiment in the present disclosure, a printed circuit board advantageous in decreasing an overall thickness and miniaturizing a product, and an electronic component package including the same may be provided.

While exemplary embodiments have been shown and described above, it will be apparent to those skilled in the art that modifications and variations could be made without departing from the scope of the present invention as defined by the appended claims.

What is claimed is:

1. A printed circuit board comprising:
 a first insulating layer;
 a first cavity disposed in one surface of the first insulating layer;
 a plurality of protrusion portions in the first cavity; and
 a first wiring layer embedded in the one surface of the first insulating layer,
 wherein the plurality of protrusion portions comprise an insulating material, and
 wherein at least one of the plurality of protrusion portions is integral with the first insulating layer.

2. The printed circuit board of claim 1, further comprising a fourth wiring layer disposed on the one surface of the first insulating layer,
 wherein the fourth wiring layer covers at least a portion of the first wiring layer.

3. The printed circuit board of claim 1, wherein the first wiring layer is exposed from the one surface of the first insulating layer, and
 a surface of the first wiring layer in contact with the first insulating layer has a roughness relatively greater than that of a surface of the first wiring layer exposed from the first insulating layer.

4. The printed circuit board of claim 1, wherein the first insulating layer includes the plurality of protrusion portions.

5. The printed circuit board of claim 1, further comprising:
 a second wiring layer disposed on another surface of the first insulating layer;
 a first via layer penetrating through at least a portion of the first insulating layer and connecting the first and second wiring layers to each other;
 a second insulating layer disposed on the another surface of the first insulating layer and having one surface in which the second wiring layer is embedded;
 a third wiring layer disposed on another surface of the second insulating layer; and
 a second via layer penetrating through at least a portion of the second insulating layer and connecting the second and third wiring layers to each other.

6. The printed circuit board of claim 5, further comprising passivation layers disposed on the one surface of the first insulating layer and the another surface of the second insulating layer.

7. The printed circuit board of claim 1, further comprising a second cavity disposed in the one surface of the first insulating layer,
 wherein the first cavity is disposed on a lower surface of the second cavity.

8. The printed circuit board of claim 7, further comprising a groove part disposed on a side surface of the second cavity.

9. The printed circuit board of claim 7, wherein the second cavity is wider than the first cavity such that an inner wall of the first cavity and an inner wall of the second cavity have a step.

10. An electronic component package comprising:
 a first printed circuit board including an insulating layer, a first cavity disposed in one surface of the insulating layer, and a plurality of protrusion portions spaced apart from each other in the first cavity;
 a second printed circuit board disposed on one side of the first printed circuit board in a stacking direction, the second printed circuit board having one surface on which the first printed circuit board is mounted;
 an electronic component mounted on the one surface of the second printed circuit board; and
 first electrical connection metals disposed between the second printed circuit board and the electronic component,
 wherein the one surface of the insulating layer of the first printed circuit board is in contact with the electronic component,
 wherein the plurality of protrusion portions comprise an insulating material,
 wherein at least one of the plurality of protrusion portions is integral with the insulating layer, and
 wherein (1) the first electrical connection metals overlap the electronic component in the stacking direction or (2) the first electrical connection metals contact the electronic component.

11. The electronic component package of claim 10, wherein the plurality of protrusion portions are in contact with one surface of the electronic component.

12. The electronic component package of claim 10, further comprising an encapsulant disposed between the first and second printed circuit boards and covering at least a portion of the electronic component.

13. The electronic component package of claim 12, wherein the encapsulant is disposed in at least a portion of the first cavity.

14. The electronic component package of claim 13, wherein the second cavity is wider than the first cavity such that an inner wall of the first cavity and an inner wall of the second cavity have a step.

15. The electronic component package of claim 13, further comprising a second cavity disposed on the one surface of the insulating layer, wherein the first cavity is disposed on a lower surface of the second cavity, and the encapsulant is disposed in at least a portion of the second cavity.

16. The electronic component package of claim 15, further comprising a groove part disposed on a side of the second cavity, wherein the encapsulant is further disposed in the groove part.

17. The electronic component package of claim 13, wherein the first printed circuit board includes:

a first wiring layer embedded in the one surface of the insulating layer; and a second wiring layer disposed on the first wiring layer and protruding from the one surface of the insulating layer.

18. The electronic component package of claim 17, wherein a surface of the first wiring layer in contact with the insulating layer has a roughness greater than that of a surface of the first wiring layer in contact with the second wiring layer.

19. The electronic component package of claim 13, further comprising:

second electrical connection metals disposed between the first and second printed circuit boards.

20. The electronic component package of claim 19, wherein a surface of the first wiring layer in contact with the insulating layer has a roughness greater than that of a surface of the first wiring layer in contact with the second electrical connection metals.

* * * * *